United States Patent [19]

Gonzales, Jr. et al.

[11] 4,313,900

[45] Feb. 2, 1982

[54] METHOD OF FORMING A CERAMIC ARTICLE WITH A GLASSY SURFACE

[75] Inventors: Frank Gonzales, Jr., Poughkeepsie; Joseph Sobon, New Paltz, both of N.Y.

[73] Assignee: International Business Machines Corp., Armonk, N.Y.

[21] Appl. No.: 163,034

[22] Filed: Jun. 26, 1980

[51] Int. Cl.³ .................... C04B 33/34; C04B 41/06
[52] U.S. Cl. ........................ 264/61; 264/60; 264/62; 264/63; 264/65; 264/66; 264/133; 501/21; 501/73
[58] Field of Search ............ 264/61, 60, 62, 63, 264/65, 104, 133; 106/47 R

[56] References Cited

U.S. PATENT DOCUMENTS

| | | | |
|---|---|---|---|
| 3,388,301 | 6/1968 | James | 317/234 |
| 3,437,505 | 4/1969 | Narken et al. | 117/23 |
| 3,536,798 | 10/1970 | Nyman | 264/62 |
| 3,540,894 | 11/1970 | McIntosh | 264/61 |
| 3,726,002 | 4/1973 | Greenstein et al. | 174/68.5 |
| 3,838,204 | 9/1974 | Ahn et al. | 174/68.5 |
| 3,941,604 | 3/1976 | Boyce | 264/63 |
| 3,956,052 | 5/1976 | Koste et al. | 219/121 LL |
| 3,991,149 | 11/1976 | Hurwitt | 264/63 |

OTHER PUBLICATIONS

IBM, TDB, vol.13, No. 4, Sep. 1970, p. 926.

*Primary Examiner*—Donald E. Czaja
*Assistant Examiner*—W. Thompson
*Attorney, Agent, or Firm*—Wolmar J. Stoffel

[57] ABSTRACT

A process for forming a glazed ceramic substrate, more particularly for forming a particular surface finish and/or surface pattern in the glass. The process consists of preparing a ceramic mixture which includes a basic oxide, such as $Al_2O_3$, and a glass, forming the substrate as by molding, pressing, or doctor blading and lamination, and sintering in a non-reactive atmosphere on a setter tile that is non-wettable by the glass. During the sintering operation the glass becomes molten and flows downwardly under the influence of gravity through the ceramic particles. The glass flows to the setter plate to conform to its surface configuration, forming a glazed surface on the substrate.

4 Claims, No Drawings

METHOD OF FORMING A CERAMIC ARTICLE WITH A GLASSY SURFACE

TECHNICAL FIELD

This invention relates to ceramics, more particularly to ceramic substrates of the type used in packages for supporting semiconductor devices, more particularly for forming a glazed or glassy surface on a ceramic substrate in which the surface of the glassy layer is provided with a particular surface finish and/or a surface pattern.

In the forming and shaping of ceramic substrates used in semiconductor device packages, it is important that the surface of the substrate be relatively smooth so that one or more metallurgy layers can be deposited on the surface to serve as fan-out patterns from device connections, and also for interconnecting metallurgy between devices mounted on a single substrate.

BACKGROUND ART

As the circuit densities of integrated circuit semiconductor devices has increased, the structure of semiconductor packages supporting the device has also become more dense and complex. Packaging substrates that support and interconnect a plurality of semiconductor devices are common. The substrate structure capable of interconnecting several integrated circuit devices where each device may have over 100 terminals, must be provided with a relatively dense and complex metallurgy system of very fine lines. The metallurgy system can be embodied within the substrate, as in the multi-layer ceramic substrate of the type described in U.S. Pat. No. 3,838,204, or IBM TDB Vol. 13 No. 4 September 1970 P. 926. Alternately, the metallurgy system can be embodied in one or more layers of conductive lines on the surface of the substrate as described in U.S. Pat. No. 3,388,301, or a combination of internal lines and surface layers as described in U.S. Pat. No. 3,726,002.

When the conductive metallurgy lines are on the top surface of a ceramic substrate, a conventional technique for forming fine lines is to evaporate a blanket layer of metal, as for example, aluminum, and subsequently remove the undesired portions of the layer by photolithographic masking and subtractive etching techniques. When more than a single metallurgy layer is desired, a blanket layer of dielectric material, such as polyimide resin, is applied over the metallurgy layer, via holes etched through the dielectric layer, and a subsequent metal layer deposited and subtractively etched.

As the lines become smaller, the nature of the surface of the ceramic substrate on which the lines are formed becomes more critical. When the surface is too rough, the etchant may get under the metal layer under a masked area and remove portions or even all of the metallurgy stripe. The masking layer on the top surface of the blanket layer of metal will not prevent this etching action. Thus the metallurgy stripes may be narrowed down to such an extent that they will fail at some later date, or in the extreme case, may be severed before the package has been completed.

A technique for producing a smooth surface on a ceramic substrate is to polish the surface. However, polishing a sintered ceramic substrate is time-consuming and expensive because the material is very hard. Another technique is to deposit a thin layer of glass on the surface of the ceramic substrate, as described in U.S. Pat. No. 3,437,505. However, in packaging technology, this technique has its limitations. If the substrate has holes for receiving pins, the surface tension of the glass produces a rounded and thinned glass layer around the holes. This is quite objectionable.

DISCLOSURE OF INVENTION

In accordance with the present invention, we provide a method for depositing a defect-free smooth glassy layer on a ceramic substrate. The method entails forming an intimate ceramic mixture of a main oxide and a glass phase into a green ceramic object of the desired shape wherein the volume of the glass phase in its molten state exceeds the void space in the sintered ceramic. The resultant molded ceramic object is placed on a setter tile of a material that is not wettable by the glassy phase and contains the desired surface configuration, and sintering the ceramic object in an ambient that is non-reactive to the glassy phase, the main oxide, and the setter tile at elevated temperatures. During the sintering operation, the glass material in the ceramic object becomes molten and flows downwardly through the ceramic particles. As the glass flows to the setter plate, it conforms to its surface configuration and results in a smooth glass surface which can be used as a base to form intricate and dense metallurgy patterns of metallurgy lines.

BEST MODE FOR CARRYING OUT THE INVENTION

In the practice of the invention, a suitable ceramic material is selected which will satisfy the requirements of the packaging application. Various physical and chemical properties must be considered, such as the dielectric constant of the material, the resistivity, coefficient of expansion, etc. In general, the softening point of the ceramic material selected must be well above the softening point of the glass which forms the second component of the green ceramic mixture which will be described in more detail. The ceramic selected must not have a reaction with the glass material at or below the sintering temperature. In general, the ceramic material should not sinter to its final density below 1200° C. Typical ceramic materials useful for practicing the method of the invention include $Al_2O_3$, BeO, and MgO, and combinations thereof including other minor constituents not listed. The particle size of the ceramic material will be in the range of 0.2 to 35 microns in diameter more particularly in the range of 0.8 to 16.0 microns. When the average particle size of the ceramic material is too large, it does not sinter well. When the particle size of the ceramic is smaller, the molten glass does not readily flow through the ceramic matrix.

A particulate glass material is combined with the aforedescribed ceramic material. The glass should have a softening point in the range of 500°–1,100° C., more particularly in the range of 950° C. to 1,010° C. which is well below the sintering temperature of the ceramic material. The glass used in the practice of the invention should not significantly react or form a crystal with the major phase of the ceramic material. The choice of the glass material is therefore dependent on the choice of the ceramic. Typical glass materials suitable for use in the practice of the invention are mixtures of CaO, MgO, $SiO_2$ and $Al_2O_3$. The amount of glass material in the green ceramic mixture will exceed the void space of the sintered ceramic. The proper amount of glass material in the green ceramic can be determined by trial and error techniques. A general guide to the amount of glass material necessary in the practice of the invention is maintaining a weight ratio in the range of 17% to 35% to the ceramic material when the size particles of the ceramic and the glass are similar. An excess of glass material over and above the void space of the sintered ceramic material is necessary in order to assure the defect-free glassy surface subsequent to the sintering operation.

The mixture of ceramic and glass particles can be further combined with a resin binder and a solvent for the binder and the resultant green ceramic mixture molded or otherwise formed into the desired substrate shape. Typical binder resins suited for practicing the method of the invention include polyvinylbutyral, polyvinylalcohol, polymethacrylates, etc. The substrate can be formed in any suitable fashion, as for example the glass and ceramic materials can be pressed into the desired shape in a mold, or, alternatively, a slurry mixture which includes binder, solvent, plasticizer which is formed into green sheets, the sheets printed, punched and assembled into a laminated structure as described in U.S. Pat. No. 3,540,894.

The shaped ceramic substrate is then placed on a suitable setter tile and sintered. The setter tile is made up of a material which is not wettable to the glass, as for example, molybdenum, tungsten, tantalum and alloys thereof. The surface of the setter tile will have the shape or texture of the desired glassy surface on the completed glass substrate. The sintering operation is preferably done in a non-reactive atmosphere such as $H_2$, $N_2$ or air, preferably with $H_2O$ added as vapor. The sintering operation will be at a temperature suited to sinter the ceramic to its final density and be well above the softening point of the glass material described previously in the mixture. During the sintering operation, the binder material, if provided, will be burned away and subsequently the glass particles softened to form a liquid. The glassy liquid will settle to the bottom side of the substrate under the influence of gravity in contact with the setter tile to form a smooth or otherwise textured glassy surface on the side of the substrate toward the setter tile. In placing the substrate on the setter tile, the top surface is placed in contact with the setter tile. When the proper amount of glass material is provided, the glass will substantially fill the spaces between the ceramic particles throughout the substrate, thereby forming an impervious body. During the sintering operation it is common for the ceramic to shrink a substantial amount. Consequently, the portions of the substrate away from the center thereof must move inwardly to accommodate the shrinkage movement. The molten glass at the interface between the setter tile and the substrate provides a lubricating effect thereby helping assure that the sintering shrinkage is uniform throughout the substrate. The glassy surface of the substrate takes on the configuration of the setter tile. If a very smooth surface is desired, the setter tile will be very smooth and polished. A smooth, polished surface on a ceramic substrate supplies a very good base for fabricating a pattern of conductive lines on the top surface to serve as interconnection metallurgy on the substrate.

The method of this invention also provides a process for forming a metallurgy pattern on the substrate without masking or subtractive etching. A conductive metallurgy system can be placed on the substrate if the top surface of the substrate can be fashioned so that the lines are recessed, i.e., depressed into the surface of the ceramic substrate. Thus, a conductive metal can be conveniently and simply deposited by wiping a suitable conductive paste across the surface of the substrate where it will be retained only in the depressed lines. This technique of providing a pre-determined pattern of conductive material on a substrate is disclosed in U.S. Pat. No. 3,956,052. In the method of this invention a ceramic substrate having a glassy layer is formed as described hereinbefore. Subsequently, the sintered substrate is deposited on a second setter tile that has the desired conductive line pattern embossed, i.e., in raised relief, on the surface of the tile. After the substrate has been carefully aligned so that the pattern on the tile corresponds to the desired location of the conductive lines on the substrate, the assembly is again re-heated to a temperature above the melting point of the glass. At this time the embossed lines on the setter tiles are impressed into the glassy layer on the substrate. After the substrate has been cooled, a suitable conductive paste can be wiped across the surface of the substrate where it will be deposited and retained in the lines formed during the second heating step.

The following examples are presented to depict preferred specific embodiments of the process of the invention and are not intended to limit the invention thereto.

EXAMPLE I

Four powdered ceramic-glass mixtures were prepared, each weighing 2000 grams. The mixtures had the following compositions:

|  | $Al_2O_3$ | Mullite | Frit ($CuO/mgO/Al_2O_3SiO_2$) |
|---|---|---|---|
| 1. | 68.3 | 20.7 | 10% |
| 2. | 64.5 | 20.5 | 15% |
| 3. | 63 | 20 | 17 |
| 4. | 60.7 | 20.5 | 20 |

The frit has a softening point of 980°±30° C. A solvent and binder system was prepared which consisted of:

| Polyvinyl butyral (PVB) (1st addition) | 34.0 gr. |
|---|---|
| Solvent for polyvinyl butyral | 925.0 gr. |
| Plasticizer | 38.3 gr. |
| Polyvinyl butyral (2nd addition) | 102.0 gr. |

The powder formulations were each placed in a 1.8 gallon pebble mill filled approximately half full with high alumina pebbles along with the 1st addition of polyvinyl butyral, the solvent, and the plasticizer and milled for 8 hours. The second addition of polyvinyl resin was added and the mixture milled for an additional 4 hours. The resultant slurry was removed from the mill, de-aired and doctor bladed into ceramic tape. The tape was then cut into squares and laminated to form substrates with from 10 to 30 sheets each. The substrates from each of the mixtures were placed on different molybdenum setter tiles with different surface finishes i.e., a smooth surface and a rough surface. All of the substrates were placed in a sintering furnace and exposed to a sintering cycle wherein the temperature was increased from room temperature to 1560° C. at 150° C./hr., the temperature maintained at 1560° C. for 3 hours, and the temperature reduced to room temperature at 100° C./hr.

Upon cooling, the substrates were examined. The substrates formed from mixtures 3 and 4 had a continuous, defect-free glazed surface which took on the characteristics of the setter tile that they were sintered on. The substrates sintered on the smooth tiles had very smooth surfaces. The substrates sintered on the rough tiles had glaze surface coatings which were approximately the same surface roughness as the tile surface. The substrates formed from mixtures 1 and 2 had no glaze surfaces and displayed dull appearing uneffective surfaces typical of ceramic material. The example indicates that there is a minimum glass percentage required in the mixture in order to obtain the glaze surface. This amount varies with the particular ceramic, the glass, and the particle sizes. It was theorized that the amount of glass frit must be such that the volume of the glass equals or exceeds the void space in the ceramic after sintering.

EXAMPLE 2

Four powdered ceramic-glass mixtures were prepared, each weighing 2000 grams. The mixtures had the following compositions:

| $Al_2O_3$ | Frit ($CaO/MgO/Al_2O_3/SiO_2$) |
| --- | --- |
| 1. 80% (by weight) | 20% (by weight) |
| 2. 83% (by weight) | 17% (by weight) |
| 3. 85% (by weight) | 15% (by weight) |
| 4. 90% (by weight) | 10% (by weight) |

The same solvent and binder system described in Example 1 was combined with the ceramic glass mixture. The same procedure was followed in shaping and sintering was used as described in Example 1.

The substrates formed from mixtures 1 and 2 has a continuous defect-free glazed surface which took on the characteristics of the setter tile that they were sintered on, i.e., a smooth surface from the smooth tile and a roughened surface from the rough tile. The substrates formed from mixtures 3 and 4 had unreflective dull surfaces, typical of sintered ceramic without any indication of a glaze surface.

EXAMPLE 3

The sintered substrates formed from mixtures 3 and 4 of Example 1, i.e., substrates with a glaze surface, were placed on molybdenum setter tiles on which lines had been etched. The substrates were reheated in a furnace at 1200° C. for 1 hour. The temperature exceeded the softening point of the glass. After cooling the substrates were inspected and it was observed that embossed lines were formed in the glaze surface corresponding to the etched line pattern on the setter tiles. This is indicative that line patterns can be formed in the glaze surface of a substrate which could be filed with electrically conductive materials, by known techniques, to form a conductive metallurgy system on the surface of a semiconductor package substrate.

We claim:

1. A method of forming a defect-free glassy surface layer on a planar surface of a ceramic substrate comprising forming an intimate ceramic mixture of a particulate ceramic material having particles with an average diameter in the range of 0.2 to 35 microns, a particulate glass material that does not react with the ceramic material when heated to temperatures sufficient to sinter the ceramic material, said glass material having a softening point in the range of 500° to 1,000° C., said glass material being present in an amount wherein the volume of the glass, when molten, equals or exceeds the void space in the ceramic material, after sintering, forming the ceramic mixture into the desired shape, placing the resultant green ceramic object on a setter tile of a material that is not wettable by the molten glass material, heating the tile and object in an ambient that is non-reactive to the molten glassy material to cause the glass material to become molten and flow downwardly through the ceramic particles to the setter tile, and subsequently sintering of the ceramic material.

2. The method of claim 1 wherein the sintered ceramic substrate is subsequently placed on a setter tile provided with an embossed mirror image surface configuration of the desired surface configuration of the metallurgy pattern on the ceramic substrate, heating the ceramic substrate and the tile to a temperature well above the softening point of the glassy material thereby forming a recessed line metallurgy pattern in the glassy material on the substrate, and filling the recessed lines with electrically conductive material.

3. The method of claim 1 wherein said particulate ceramic material is a mixture of $Al_2O_3$ and mullite, and the glass material is present in an amount equal to or in excess of 17% by weight of the mixture.

4. The method of claim 1 wherein said particulate ceramic material is substantially $Al_2O_3$, and the glass material is present in an amount equal to or in excess of 17% by weight of the mixture.

* * * * *